United States Patent [19]

Hieda et al.

[11] Patent Number: 5,313,438
[45] Date of Patent: May 17, 1994

[54] DELAY APPARATUS

[75] Inventors: Teruo Hieda, Kawasaki; Hidetoshi Wada, Yokohama, both of Japan

[73] Assignee: Canon Kabushiki Kaisha, Tokyo, Japan

[21] Appl. No.: 78,781

[22] Filed: Jun. 16, 1993

Related U.S. Application Data

[63] Continuation of Ser. No. 614,288, Nov. 16, 1990, abandoned.

Foreign Application Priority Data

Nov. 20, 1989 [JP] Japan .................................. 1-299634

[51] Int. Cl.⁵ .............................................. G11C 13/00
[52] U.S. Cl. .................................. 365/238; 365/149; 365/238.5
[58] Field of Search .............. 365/238, 78, 149, 238.5, 365/45, 49

[56] References Cited

U.S. PATENT DOCUMENTS

| | | | |
|---|---|---|---|
| 2,854,590 | 9/1958 | Wolfe | 365/45 |
| 3,763,480 | 10/1973 | Weimer | 365/78 |
| 3,986,176 | 10/1976 | Weimer | 365/45 |

Primary Examiner—Terrell W. Fears
Attorney, Agent, or Firm—Robin, Blecker, Daley & Driscoll

[57] ABSTRACT

A delay apparatus comprises one or a plurality of shift registers, a plurality of signal accumulating capacitors which are mutually coupled by transfer transistors, a plurality of write switches each of which is arranged between an input terminal and either one of the capacitors and which are controlled by outputs of the shift registers, and a plurality of read switches which are arranged between the plurality of capacitors and an output terminal and are controlled by the outputs of the shift registers, wherein the signal charges accumulated in the one capacitor are capacitively divided into other capacitors through the transfer transistors for transferring the signal charges.

12 Claims, 4 Drawing Sheets

DELAY APPARATUS

This is a continuation application under 37 CFR 1.62 of prior application Ser. No. 614,288, filed Nov. 16, 1990.

BACKGROUND OF THE INVENTION

1. Field of the Invention

The present invention relates to a delay apparatus which is used in processing of a video signal or the like.

2. Related Background Art

In a video apparatus such as a video camera, VTR, television receiver, or the like, a delay element for delaying a video signal by one horizontal period or a period of time which is 1/2 or an integer times as long as one horizontal period is a significant element to execute processes such as separation, vertical outline correction, skew correction, and the like of chrominance signals. Further, the delay element is also necessary to execute a special effect such as to expand a part of an image pickup signal in a time-dependent manner. In the above video apparatuses, in recent years, the realization of miniaturization, high performance, and low electric power consumption have particularly progressed. Characteristics similar to the above are also demanded for the delay element.

Hitherto, a glass delay line or a CCD (charge coupled device) delay line is mainly used to accomplish the above object. According to the glass delay line, electric/mechanical converting elements are arranged at both ends of the glass and a signal is delayed by using the time which is required for an ultrasonic wave to be propagated in the glass. On the other hand, according to the CCD delay line, a predetermined number of CCDs are driven by predetermined clocks and a signal is delayed by using a transfer time which is required to transfer the signal from one edge of the CCD to the other edge.

In the above delay elements, there is a limitation to further realize the miniaturization high performance, and low electric power consumption for reasons in structure and manufacturing.

For instance, in the case of the glass delay line, the signal of a low frequency cannot be delayed due to the conversion characteristics of the electric/mechanical converting element or the transfer characteristics of the glass. Therefore, before the signal is input to the delay apparatus, the signal must be certainly modulated at a high frequency and the delayed signal must be demodulated. Thus, modulating and demodulating circuits are necessary. Further, since it is impossible to extremely delay the velocity of a sound wave which is propagated in the glass, there is also a limitation in reducing the length of the glass.

On the other hand, in the case of the CCD delay line, since a transfer driving electrode has a fairly large capacity in principle, a drive pulse consumes a large electric power. In addition, since the amount of charges to be transferred is large, a voltage of about 10V is needed.

Moreover, in order to execute the special effect as mentioned above by the conventional delay element, there is a problem such that a structure and peripheral circuits of such a delay element are very complicated.

SUMMARY OF THE INVENTION

The present invention is made in consideration of the above problems and it is an object of the invention to provide a delay apparatus small in size, having a high performance, and a low electric power consumption.

To accomplish the above object, a delay apparatus according to the invention is constructed as shown in embodiments (1) and (2).

(1) There is provided a delay apparatus comprising: one or a plurality of shift registers; a plurality of signal accumulating capacitors which are mutually coupled by transfer transistors; a plurality of write switches each of which is arranged between an input terminal and either one of the capacitors and which are controlled by outputs of the shift registers; and a plurality of read switches which are arranged between the plurality of capacitors and an output terminal and are controlled by the outputs of the shift registers, wherein the signal charges accumulated in the one capacitor are capacitively divided into other capacitors through the transfer transistors for transferring the signal charges.

(2) There is also a delay apparatus having a plurality of combinations each comprising shift registers, capacitors, write switches, and read switches in the delay apparatus of embodiment (1).

According to the constructions of embodiments (1) and (2), the signal charges from the input terminal are accumulated into the capacitors through the write transistors at predetermined timings, the signals are output from the capacitors to the output terminal through the read transistor at predetermined timings, and the delayed output signal is obtained.

The above and other objects and features of the present invention will become apparent from the following detailed description and the appended claims with reference to the accompanying drawings.

DETAILED DESCRIPTION OF THE PREFERRED EMBODIMENTS

An embodiment of the present invention will be described hereinbelow with reference to the drawings.

Figure 1:
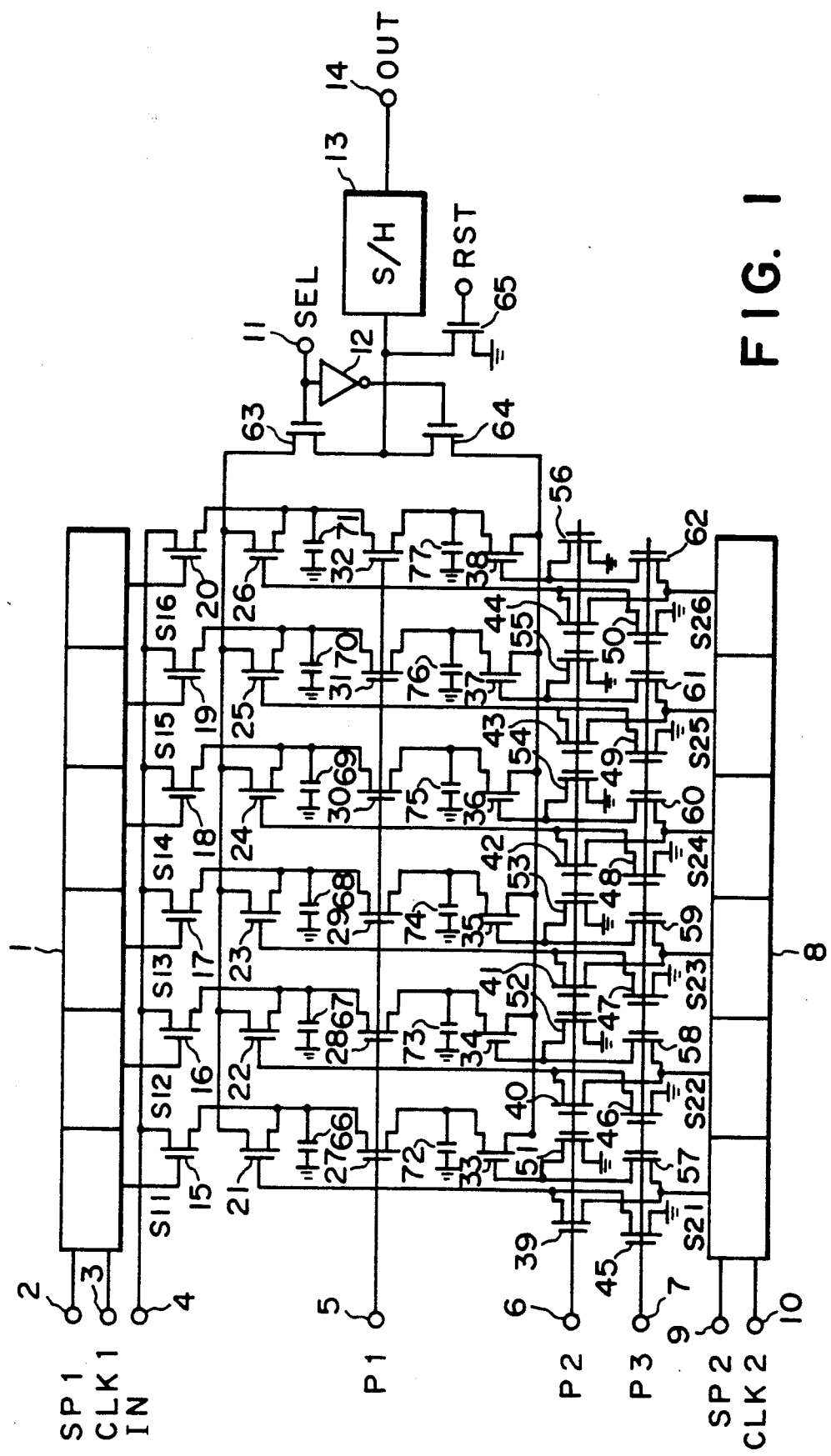
FIG. 1 is a circuit diagram of an embodiment of the invention.

FIG. 1 is a circuit diagram of a delay apparatus according to an embodiment of the invention. In FIG. 1, for simplicity of explanation, the delay apparatus is constructed by six stages and two columns. However, actually, the apparatus can be constructed by predetermined numbers of stages and columns in accordance with a frequency band and a delay time of a signal which is input and the number of horizontal lines to be delayed.

Reference numerals 1 and 8 denote shift registers; 3 and 10 indicate clock input terminals to execute the shifting operations of the shift registers 1 and 8; 2 and 9 start pulse input terminals to start the operations of the shift registers; 4 is a signal input terminal; 5, 6, 7, and 11 are drive pulse input terminals; 12 is an inverter; 13 is a sample and hold circuit; 14 is an output terminal; 15 to 65 are transistors such as MOSFETs or the like (hereinafter, abbreviated as transistors); and 66 to 77 are signal accumulating capacitors.

Each time clocks are given to the terminals 3 and 10 after start pulses were given to the terminals 2 and 9, the shift registers 1 and 8 sequentially generate output pulses in accordance with the order of S11, S12, S13, S14, S15, and S16 and the order of S21, S22, S23, S24, and S25.

The input signal is input from the signal input terminal 4 and passes through one of the write transistors 15 to 20 which is selected by each of the output pulses S11 to S16 of the shift register 1 and is accumulated into either one of the capacitors 66 to 71. At this time, since a drive pulse $P_1$ of the terminal 5 is at the L level, the transistors 27 to 32 are turned off. The write transistors 15 to 20 which are selected by the output pulses S11 to S16 are successively selected by clock pulses which are supplied to the clock input terminal 3 as mentioned above, while the signal accumulating capacitors are also successively selected. Then, the signals accumulated in the capacitors 66 to 71 as mentioned above pass through the transfer transistors 27 to 32 and are transferred into the capacitors 72 to 77 for a horizontal blanking period of time of a television period since an H level signal is applied to the terminal $P_1$ for a predetermined time. The signals are capacitively divided into the capacitors 66 and 71. Assuming that the capacity of each of the capacitors 66 to 71 and 72 to 77 is equal, the signals are divided into the capacitors so as to have the same charges. Then, when a drive pulse $P_2$ of the terminal 6 is set to the H level, a drive pulse $P_3$ of the terminal 7 is set to the L level, a selection pulse SEL of the terminal 11 is set to the H level, a start pulse $SP_2$ is applied to the terminal 9, and a clock $CLK_2$ is applied to the terminal 10, the output pulses S21 to S26 are sequentially selected and output and pass through the transistors 39 to 44 and are selectively supplied to either one of the read transistors 21 to 26, so that the corresponding transistor is turned on. Therefore, the charges accumulated in on of the capacitors 66 to 71 corresponding to the transistors which were turned on are read out. Since the selection pulse SEL is at the H level, the read-out charges pass through the transistor 63 and the sample and hold circuit 13 and are output from the output terminal 14. In the next blanking period, the drive pulse $P_2$ is set to the L level, the drive pulse $P_3$ is set to the H level, and the pulse SEL is set to the L level. When one of the output pulses S21 to S26 is selected for the next effective period of time, one of the read transistors 33 to 38 is selected via the transistors 57 to 62, the charges are read out from one of the capacitors 72 to 77, and the read-out charges pass through the transistor 64 and are sampled and held by the sample and hold circuit 13 and are output from the output terminal 14. At this time, since the charges accumulated in the capacitors 66 to 71 are equal to the charges accumulated in the capacitors 72 to 77 as mentioned above, the same signal is output for two horizontal periods.

Figure 2A:
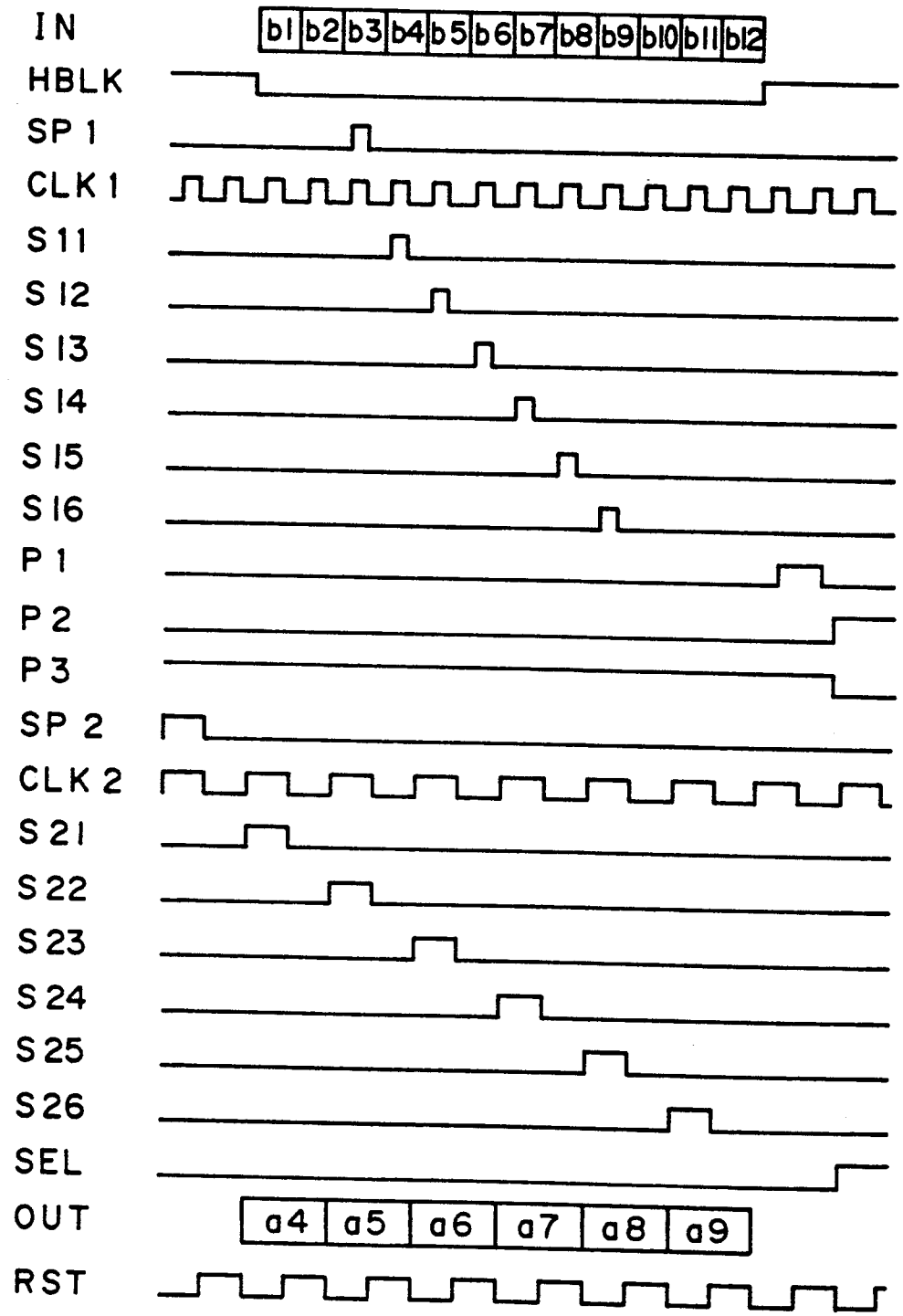
FIGS. 2A, 2B, and 2C are timing charts showing the operations of the embodiment.
Figure 2B:
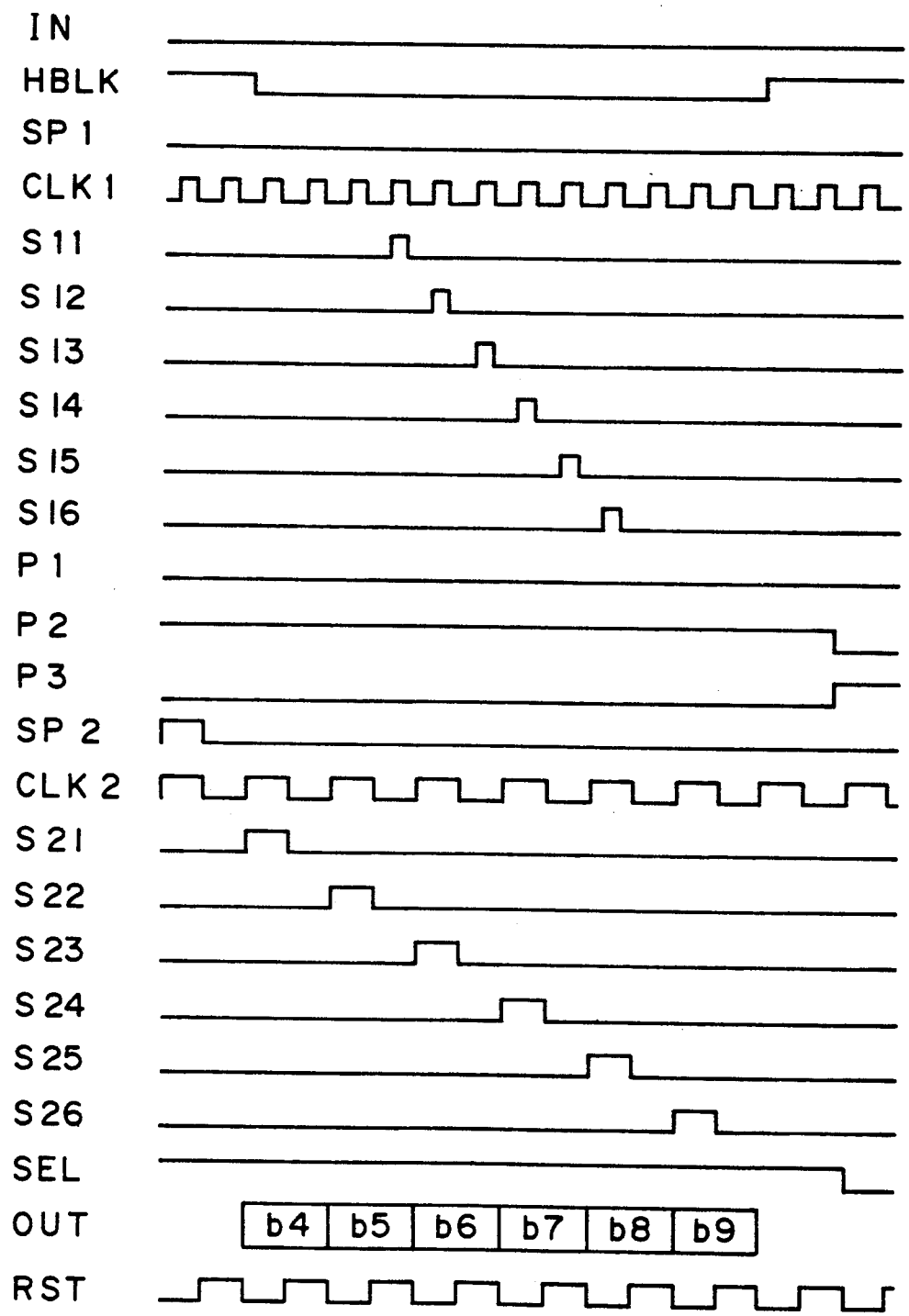
Figure 2C:
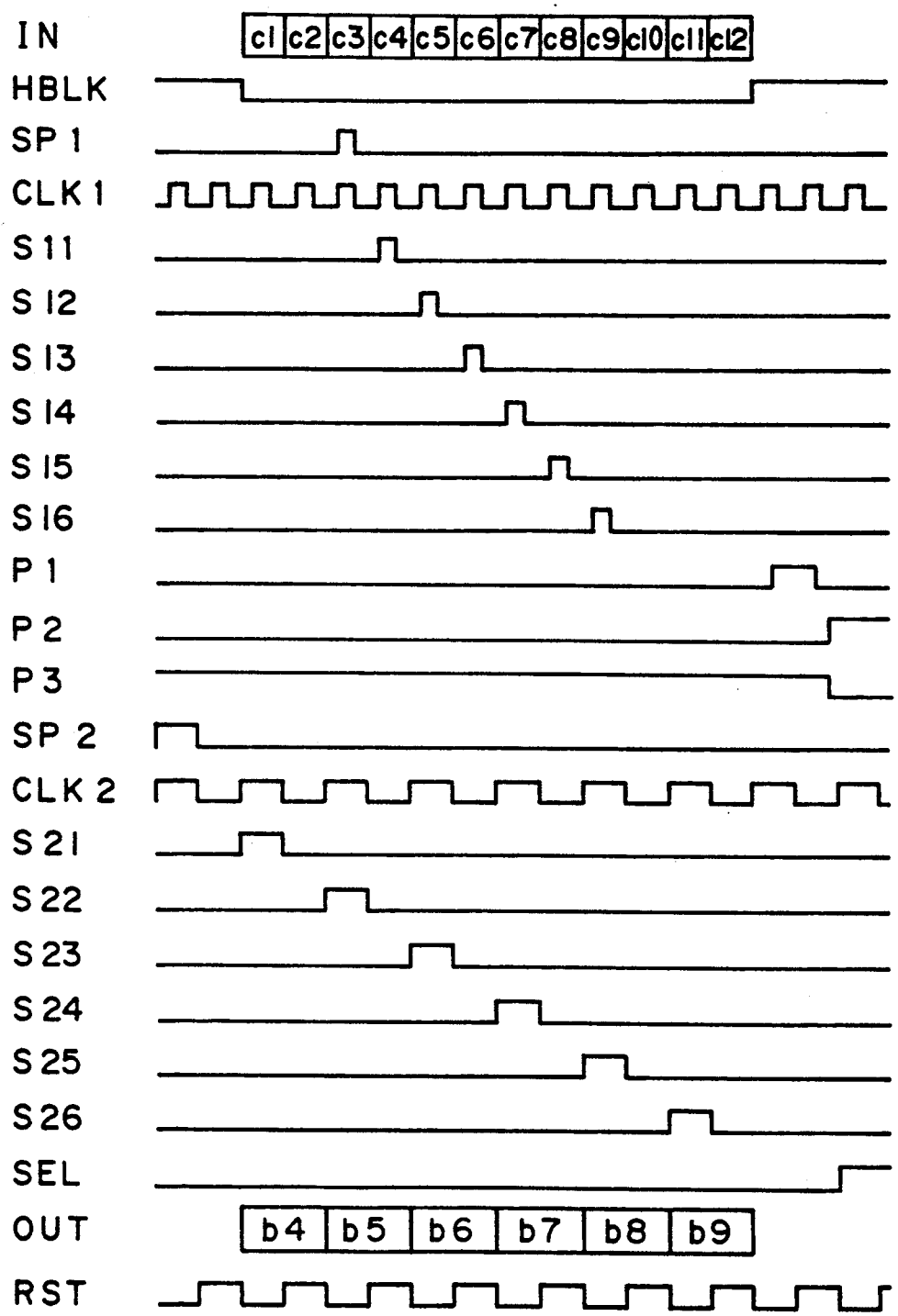

FIGS. 2A to 2C are operation timing charts of the delay apparatus of FIG. 1. FIG. 2A shows the first horizontal period. FIG. 2B shows the second horizontal period subsequent to FIG. 2A. FIG. 2C shows the third horizontal period subsequent to FIG. 2B. In the diagrams, 12 clocks per horizontal period are applied. However, as mentioned above, the number of clocks which are applied per horizontal period can be set to a proper value in accordance with the necessary signal band, delay time, and the number of horizontal lines to be delayed. In FIG. 2A, each time the start pulse $SP_1$ is generated and the operation of the shift register 1 is started and the clock $CLK_1$ is applied, the output pulses S11 to S16 are successively generated. On the other hand, input signals $b_1$ to $b_{12}$ are supplied to an input terminal IN. When an attention is paid to the capacitor 66 in FIG. 1 the write transistor 15 is first made conductive by the output pulse S11 and the signal $b_4$ is accumulated into the capacitor 66. After that, in the horizontal blanking period of a television period, a horizontal blanking pulse HBLK is set to the H level and the drive pulse $P_1$ is set to the H level for a predetermined period of time. As mentioned above, a state in which the same signal charges 4b were accumulated in the capacitors 66 and 72 is obtained. After that, the drive pulse $P_2$ is set to the H level and the drive pulse $P_3$ is set to the L level.

In FIG. 2B, the start pulse $SP_1$ is not generated and the shift register 1 is not made operative different from the case of FIG. 2A. When the start pulse $SP_2$ is applied, the shift register 8 generates the output pulses $S_{21}$ to $S_{26}$ each time the clock $CLK_2$ is applied. At this time, since the drive pulse $P_2$ is at the H level and the drive pulse $P_3$ is at the L level and the selection pulse SEL is at the H level, the signal charges $b_4$ to $b_9$ accumulated in the capacitors 66 to 71 are sequentially output. After that, when the horizontal blanking period comes, the drive pulse $P_2$ is set to the L level, the drive pulse $P_3$ is set to the H level, and the selection pulse SEL is set to the L level.

In FIG. 2C, each time the start pulse $SP_2$ is applied and the clock $CLK_2$ is applied, the output pulses $S_{21}$ to $S_{26}$ are generated, so that the signal charges $b_4$ to $b_9$ accumulated in the capacitors 72 to 77 are sequentially read out and are output from the output terminal 14. In FIGS. 2A to 2C, a pulse to eliminate the remaining unnecessary charges on the output signal line is applied to a reset terminal RST.

As mentioned above, according to the embodiment, the signal charges accumulated for one horizontal period can be delayed and output for subsequent two horizontal periods. A delay apparatus being small in size, and having, a high performance, and a low electric power consumption can be obtained.

As will be understood from the above description, the invention is not limited to the MOSFET type as a transistor but any proper type of transistors can be used. In addition, the circuit construction can also use a proper combination of shift registers, capacitors, and write transistors and read transistors which are controlled by the shift registers.

As described in detail above, according to the invention, since a combination of the shift registers, capacitors, and transistors is used, a delay apparatus being small in size, and having a high performance, and a low electric power consumption can be realized.

We claim:

1. A delay apparatus comprising:
    at least one shift register;
    a first group of a plurality of capacitors connected to transfer transistors respectively, each for accumulating a signal;
    a plurality of write switches each of which is arranged between an input terminal and each of said plurality of capacitors of the first group and is controlled by an output of the shift register, for writing signals inputs to said input terminal into said plurality of capacitors of the first group, respectively;
    a second group of a plurality of capacitors connected to said transfer transistors respectively, each for accumulating a signal divided from the signal accumulated in each of said plurality of capacitors of the first group; and output means for outputting the signal accumulated in said plurality of capacitors of the first group and the signal accumulated in said plurality of capacitors of the second group, in a predetermined period.

2. An apparatus according to claim 1, wherein said delay apparatus has a plurality of combinations each comprising the shift register, the first group of a plurality of capacitors, the transfer transistor, the plurality of write switches and the second group of a plurality of capacitors.

3. An apparatus according to claim 1, wherein said output means includes first reading means for reading out the signal accumulated in the first group of capacitors.

4. An apparatus according to claim 3, wherein said output means includes second reading means for reading out the signal accumulated in the second group of capacitors.

5. An apparatus according to claim 4, wherein said output means includes drifting means for alternately making the first and second reading means operative.

6. An apparatus according to claim 5, wherein the driving means switches and drives the first and second reading means every horizontal period of a television period.

7. A process apparatus comprising:

a) a first line memory for receiving a first line signal for a first period and for storing the received first line signal;

b) a second line memory for receiving a second line signal divided from said first line signal stored in the first line memory and for storing the received second line signal; and c) control means for reading out said first and second line signals from said first and second line memories for a second period different from said first period.

8. An apparatus according to claim 7, wherein the first memory includes a plurality of capacitors.

9. An apparatus according to claim 8, wherein the second memory includes a plurality of capacitors.

10. An apparatus according to claim 7, further including switching means, arranged between the first and second memories, for selectively transferring a part of the signal accumulated in the first memory to the second memory.

11. An apparatus according to claim 7, wherein said first line memory and said second line memory, respectively, have a capacity for storing one horizontal line signal.

12. An apparatus according to claim 11, wherein said first line signal and said second line signal are each one horizontal line signal.

* * * * *